US005846858A

United States Patent [19]
Kerber

[11] Patent Number: 5,846,858
[45] Date of Patent: Dec. 8, 1998

[54] SOI-BICMOS METHOD

[75] Inventor: Martin Kerber, Munich, Germany

[73] Assignee: Siemens Aktiengesellschaft, Munich, Germany

[21] Appl. No.: 635,525

[22] Filed: Apr. 22, 1996

[30] Foreign Application Priority Data

Apr. 28, 1995 [DE] Germany .......................... 195 15 797.4

[51] Int. Cl.$^6$ ..................... H01L 21/8238; H01L 21/331; H01L 21/8222
[52] U.S. Cl. ........................... 438/204; 438/311; 438/339; 438/355; 438/374; 438/377
[58] Field of Search ..................... 438/204, 310, 438/335, 339, 353, 355, 374, 375, 377, 311

[56] References Cited

U.S. PATENT DOCUMENTS

| 3,598,664 | 8/1971 | Kilby ........................................ 438/355 |
| 5,147,818 | 9/1992 | Hikida . | |

FOREIGN PATENT DOCUMENTS

| 0137992 | 4/1985 | European Pat. Off. . |
| 0474564 | 11/1992 | European Pat. Off. . |
| 0616371 | 9/1994 | European Pat. Off. . |

OTHER PUBLICATIONS

Patent Abstracts of Japan, (E–1537) Apr. 14, 1994, vol. 18, No. 210, Thin Film Bipolar Transistor and Thin Film Semiconductor Device Using It, H. Yamada, JP 6–13397.

Patent Abstracts of Japan, (E–1361) May 11, 1993, vol. 17, No. 230, Manufacture of Semiconductor Device, K. Suzuki, JP 4–360539.

Patent Abstracts of Japan (E–1541) Apr. 22, 1994, vol. 18, No. 225, Semiconductor Device and Manufacture Thereof, K. Arai, JP 6–21077.

IEEE Electron Device Letters, vol. 4, No. 8, Aug. 1983, "Fully Isolated Lateral Bipolar–MOS Transistors Fabricated in Zone–Melting–Recrystallized Si Films on SiO", Tsaur et al, pp. 269–271.

IEEE Electron Device Letters, vol. 14, No. 1, Jan. 1993, "A High–Performance Lateral Bipolar Transistor Fabricated on SIMOX", Parke et al, pp. 33–35.

Publication IEDM 92, (1992), "A Versatile, SOI BiCMOS Technology with Complementary Lateral BJT's", S. Parke et al, pp. 453–456.

*Primary Examiner*—Brian Dutton
*Attorney, Agent, or Firm*—Hill & Simpson

[57] ABSTRACT

In a manufacturing method for lateral bipolar transistors on an SOI substrate, a ridge-shaped gate electrode (8/9) is applied onto a mesa (3) provided with a basic doping and is covered surface-wide with a TEOS layer (10) that has vertical portions functioning as spacers (11,12) at the sidewalls of this gate electrode. Dopants for a collector region (4) and an emitter region (6) are introduced using lacquer masks (13,14). After the removal of the TEOS layer (10), the base implantation ensues in the region of the spacer (11) along an edge of the gate electrode.

18 Claims, 2 Drawing Sheets

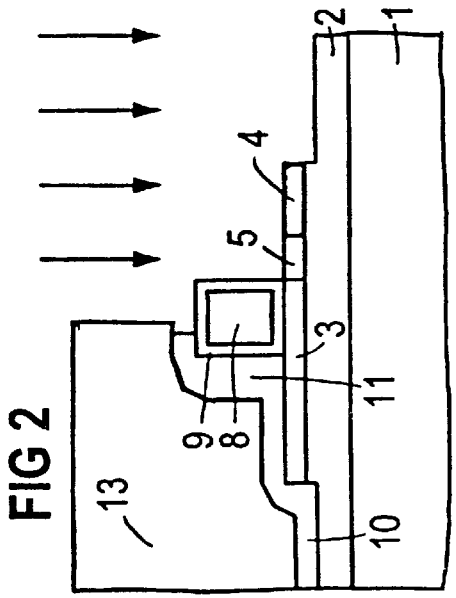
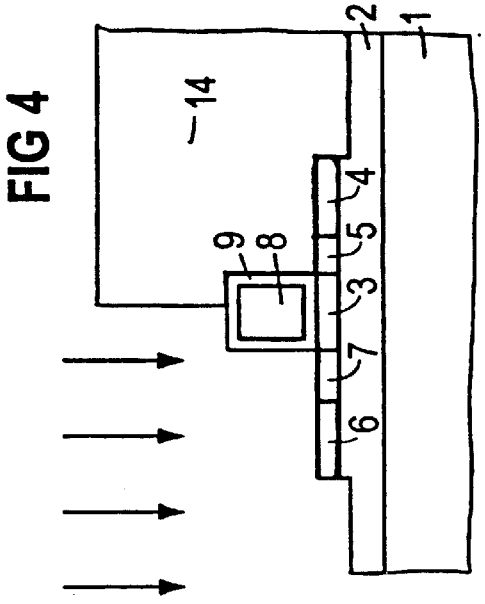
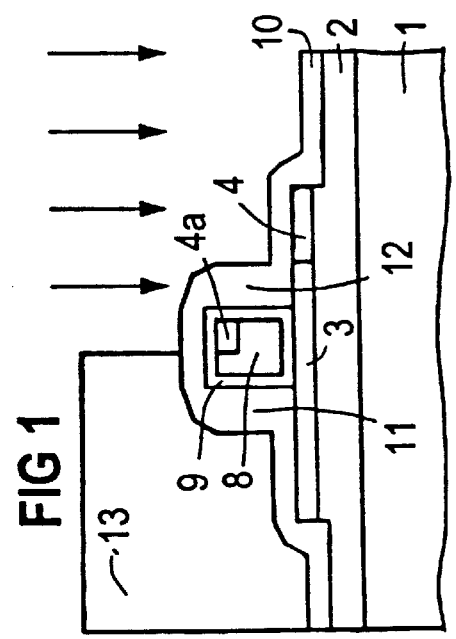
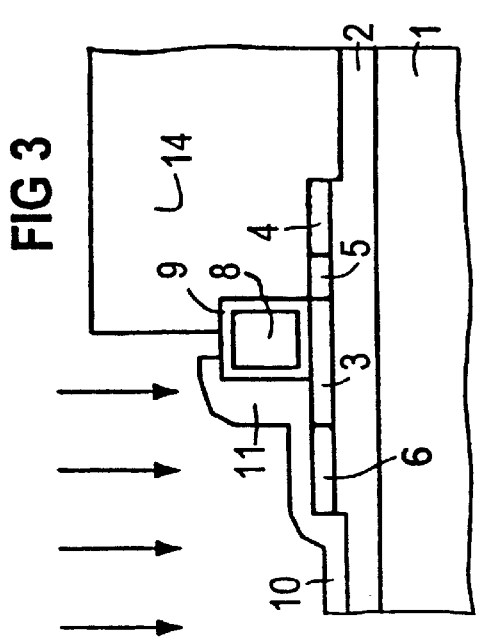

SOI-BICMOS METHOD

BACKGROUND OF THE INVENTION

The present invention is directed to a manufacturing method for lateral bipolar transistors that is compatible with CMOS technology.

The publication IEDM 92, pages 453 through 456, discloses a method with which lateral bipolar transistors are manufactured on an SOI substrate. First, a mesa is produced in the silicon body and coated with an oxide layer. Respectively separate mesas that are provided with a respective basic doping, n-conductive or, p-conductive, are produced for the complementary transistors. Ridge-shaped gate electrodes are produced with a polysilicon layer that is applied surface-wide and subsequently structured, these gate electrodes being subsequently employed as an implantation mask for dopant for the respective base region. That the dopant, which is initially anisotropically introduced, laterally diffuses out under the region covered by the gate electrode and thus forms the region provided for the base is achieved with a suitable temperature step. The dopings for the emitter and collector region are introduced with another anisotropic implantation. A lightly doped transition region thereby remains under the gate electrode between the base region and the collector region. Terminals are then manufactured for the various terminal regions and the gate electrode.

SUMMARY OF THE INVENTION

It is an object of the present invention to provide an improved manufacturing method for lateral bipolar transistors that can be better integrated into the CBiCMOS process.

In general terms the present invention is a method for manufacturing a lateral bipolar transistor and has the following steps:

a) a semiconductor layer is laterally insulated and provided with a basic doping for electrical conduction of a first conductivity type;

b) a stripe-shaped gate electrode is applied on to this semiconductor layer adjoining a region provided for a base region;

c) a dielectric layer is applied over this semiconductor layer and this gate electrode;

d) the following steps e) through h) occur in the sequence in which they are recited, the following steps i) through l) occur in the sequence in which they are recited, and, after step l), the following steps m) and n) occur successively;

e) using a first mask with an opening that, with reference to the plane of this semiconductor layer, is present laterally next to this gate electrode on a side facing away from the region provided for a base region and extends at least up to a region occupied by the gate electrode, a dopant for electrical conduction of this first conductivity type is introduced into this semiconductor layer;

f) this dielectric layer is removed in the region of this opening of the first mask;

g) a dopant for electrical conduction of this first conductivity type is again introduced into this semiconductor layer; and h) the first mask is removed;

i) using a second mask having an opening that, with respect to the plane of this semiconductor layer, is present next to this gate electrode on a side facing toward this region provided for a base region and extends at least up to a region occupied by the gate electrode, a dopant for electrical conduction of this first conductivity type is introduced into this semiconductor layer;

j) this dielectric layer is removed at least in the region provided for this base region;

k) a dopant for electrical conduction of the second conductivity type opposite this first conductivity type is introduced into this region using the second mask, whereby the height of this doping is selected such that the doping for electrical conduction of the first conductivity type predominates at a side of this region facing away from this gate electrode;

l) the second mask employed in step k) is removed;

m) using a third mask that has an opening in a region provided for a base terminal zone, a dopant for electrical conduction of the second conductivity type is introduced into this semiconductor layer; and n) the third mask is removed.

Advantageous developments of the present invention are as follows.

The same mask as in step i) is employed in step k).

In step i), a first mask is employed whose opening is limited to the region covered by the third mask employed in step m). The first mask employed in step i) is removed between step i) and step j) and is replaced before step k) by the second mask provided for step k).

The method is used for simultaneous manufacture of a MOSFET. In step b), at least one gate electrode provided for a MOSFET is also applied. In at least one of the steps e), i), and m), a doping for a drain region of a MOSFET is also introduced. In step e), a doping for a drain region of a MOSFET is also introduced. In step g), a doping for a lightly doped transition region between this drain region and a channel region provided for the same MOSFET is introduced.

Complementary MOSFETs can also be manufactured as a BiCMOS method. In at least one of the steps e) and i), a doping for a drain region of a MOSFET is also introduced. In step m), a doping for a drain region of a complementary MOSFET is also introduced.

Bipolar transistors of a first type and of a second type complementary therewith can be manufactured. As a step o) the steps a) through c) ensue in common for the bipolar transistors to be manufactured and the basic doping is thereby respectively produced with the conductivity type of emitter and collector of the type to be manufactured. As a step p) the sequence of steps d) is implemented for the first type of transistors to be manufactured. As a step q) a sequence of steps that corresponds to the sequence of steps d) with respectively interchanged conductivity types is implemented for the second type of transistors to be manufactured. In the sequence of steps p), the step m) is implemented such that a step of the sequence of steps q) corresponding to the step e) or the step i) ensues simultaneously therewith with dopant of the second conductivity type.

Complementary MOSFETs can be manufactured as a CBiCMOS method, whereby in the sequence of steps q), the step corresponding to the step e) with dopant for the second conductivity type is implemented such that a dopant for a drain region of a MOSFET is simultaneously introduced therewith. In the sequence of steps q), the step corresponding to the step g) with dopant for the second conductivity type is implemented such that a doping for a lightly doped transition region between this drain region and a channel region provided for the same MOSFET is simultaneously introduced therewith.

A basic doping for the collector between base and collector terminal regions is employed in the inventive method. The vertical portions of a surface-wide dielectric layer that are present at the side-walls of the ridge-shaped gate electrode are employed as spacers in order to first introduce the dopant for the emitter region and to implant the base region after the removal of this dielectric layer.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIGS. 1–4 show cross-sections through the inventively manufactured bipolar transistor after various steps in the method.

DESCRIPTION OF THE PREFERRED EMBODIMENTS

Figure 5:
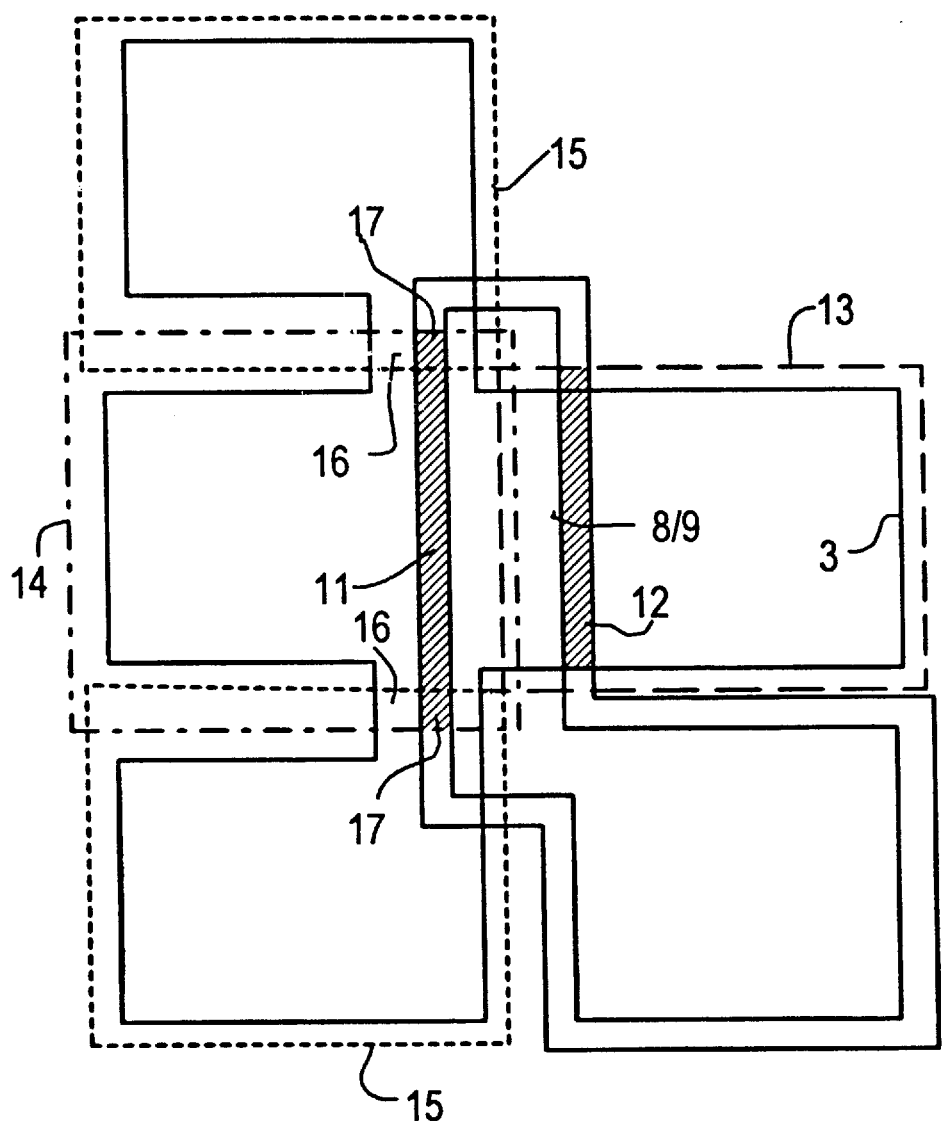
FIG. 5 schematically shows the arrangement of the various doped regions in a plan view.

In this method, a limited region is electrically insulated on all sides in the body silicon layer, for example in conformity with a CMOS process on an SOI substrate. This can occur, for example, with a local oxidation (LOCOS) or by etching out a mesa. A gate electrode of, for example, silicon is applied and structured, for example, ridge-shaped. An oxidation with which a thin oxide layer that covers this gate electrode at the upper sides and the lateral surfaces is usually implemented thereafter. FIG. 1 shows an SOI substrate having a bulk silicon layer 1, an insulator layer 2 and the mesa that is produced in the body silicon layer and provided with a basic doping for the conductivity type of emitter and collector. The gate electrode 8 is provided with the thin oxide layer 9. A dielectric layer, for example TEOS (tetraethylorthosilicate), is then deposited surface-wide as auxiliary layer 10. Vertical portions of this auxiliary layer 10 are located at the sidewalls of the gate electrode 8, these being employed as spacers 11,12 in following method steps. In the illustrated exemplary embodiment, the left-hand spacer 11 in the drawing is located at the side of the base to be manufactured, whereas the right-hand spacer 12 is located over the collector region. Dopant, which is shielded by the respective vertical portion of the auxiliary layer 10, is then introduced according to the entered arrows using a mask 13. In the illustrated exemplary embodiment, the collector region is manufactured first, so that dopant is shielded by the right-hand spacer 12. The dopant proceeds through the horizontal portions of the auxiliary layer 10 into the mesa in order to form the collector region 4 therein. The part of the dopant that proceeds into the material of the gate electrode is region 4a. For the sake of clarity, the doped regions in the gate electrode that arise in the implantation steps are omitted from the following FIGS. 2–4. Given an n-conductive basic doping in the mesa 3, the silicon of the collector region can, for example, be n-conductively doped with arsenic. The auxiliary layer 10 is then removed in the region the mask 13 leaves free, and dopant, for example phosphorous, is again introduced in order to produce the lightly doped collector regions 5. Potentially, this method step can be omitted. It is recommended, however, when MOSFETs are manufactured together with the bipolar transistor, a lightly doped transition regions is provided between drain and channel region for these MOSFETs. The corresponding implantation step can then be simultaneously utilized for the implantation step for manufacturing the collector region 5 shown in FIG. 2.

FIGS. 3 and 4 show the manufacture of the emitter and base regions. This part of the method can ensue just as well before the manufacture of the collector region. The emitter region 6 is implanted through the auxiliary layer 10, whereby the vertical portion of the auxiliary layer 10, as spacer, shields the region provided for the base. Given an n-conductive basic doping for the manufacture of an npn transistor, arsenic, for example, can be employed as the dopant for the emitter. The auxiliary layer 10 is subsequently removed. The property can thereby be exploited that TEOS is etched noticeably faster than the thermic oxide 9 surrounding the gate electrode, so that this represents an adequate etch stop. An implantation for the opposite conductivity type is then introduced. The dose of this implantation is thereby set such that, according to FIG. 4, the base region 7 is produced laterally adjoining the gate electrode but the operational sign of the doping of the emitter region is not reversed. According to FIG. 4, a sequence composed of a highly doped emitter region 6, an oppositely doped base region 7, the lightly doped collector regions 3,5 (the collector region 3 adjoining the base still having the original basic doping), and the highly doped collector region 4 is then situated in the mesa 3. The mask 14 used in these implantation steps for emitter and base is subsequently removed.

FIG. 5 schematically shows the arrangement of the doped regions in a plan view. Depicted are the borders of the mesa 3 and the layer applied for the gate electrode 8/9. Only the vertical portions of the auxiliary layer 10 present at the sidewalls of the gate electrode are entered as a doubling of the border, and the regions functioning as spacers 11,12 are specifically emphasized. The opening 13a of the mask 13 employed in the steps shown in FIGS. 1 and 2 is depicted by the broken line. This rectangular region in this example corresponds to the region of the implantation of the collector. The opening 14a of the mask 14 employed in the steps shown in FIGS. 3 and 4 is depicted by the dot-dashed line. After the implantation of emitter and base, a doping for electrical conduction of the conductivity type of the base (here, for example, p-conduction) for a high doping density is introduced into the base terminal regions of the mesa using a further mask 15 having opening 15a, which is depicted by dotted borders. Given the overlap of the openings 14a and 15a of the mask 14 and the mask 15 in FIG. 5, the transition regions 16 result between base and emitter wherein the doping of the emitter is respectively overcompensated by the high doping of the base terminal regions. The collector region 5 manufactured in the step of FIG. 2 and the base region 7 manufactured in the step illustrated in FIG. 4 are shown with shading in FIG. 5. The end regions 17 of the base region are more highly doped than the rest of the base region because the high doping of the base terminal regions is added to the basic doping here. The pnp transistors are analogously manufactured, whereby the emitter and base regions thereof are merely realized with a further resist mask and correspondingly interchanged implantations.

When the auxiliary layer 10 above the emitter region to be manufactured is too thick in order to enable an adequately high doping, this auxiliary layer 10 can be anisotropically etched back in controlled fashion immediately after the deposition or application of the resist mask. The spacer effect of the vertical portions is thereby preserved, but the effective thickness of the stray (scattering) oxide in the terminal regions of emitter and collector to be produced is reduced, this allowing a shallower implantation. When the electric property of the emitter-base junction is inadequate in the transition region 16 between the emitter terminal and the base terminal region as a consequence of the relatively high concentration of the dopants, a separate resist mask whose opening 15a does not overlap with the opening of the mask 15 provided for the doping of the base terminal regions can be provided for the implantation of the emitter. Given integration of the inventive method in a CMOS process wherein complementary MOSFETs are manufactured, the drain region of the MOSFETs respectively corresponding to the operational sign of the conductivity is manufactured together with the implantation of the base terminal region of the bipolar transistor. As mentioned, the drain regions of the MOSFETs complementary thereto are manufactured in the method step for manufacturing the collector region shown in FIGS. 1 and 2. A far-reaching integration of the manufacturing method for lateral bipolar transistors of both the npn as well as pnp type in the CMOS process is therefore possible with the inventive method.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for manufacturing a lateral bipolar transistor, comprising the steps of:

a) laterally insulating a semiconductor layer and providing the semiconductor layer with a basic doping for electrical conduction of a first conductivity type;

b) applying a stripe-shaped gate electrode onto the semiconductor layer adjoining a region provided for a base region;

c) applying a dielectric layer over the semiconductor layer and the gate electrode;

d) sequencing the following steps e) through h) in the sequence in which said steps e) through h are recited, sequencing the following steps i) through l) in the sequence in which said steps i) through l are recited, and, after step l), the following steps m) and n) sequence successively;

e) using a first mask with an opening that, with reference to a plane of the semiconductor layer, is present laterally next to the gate electrode on a side facing away from said region provided for said base region and that extends at least up to a region occupied by the gate electrode, introducing a first dopant for electrical conduction of the first conductivity type into the semiconductor layer;

f) removing the dielectric layer in the region of the opening of the first mask;

g) introducing a second dopant for electrical conduction of the first conductivity type into the semiconductor layer; and h) removing the first mask;

i) using a second mask having an opening that, with respect to the plane of the semiconductor layer, is present next to the gate electrode on a side facing toward the base region and that extends at least up to said region occupied by the gate electrode, introducing a third dopant for electrical conduction of the first conductivity type into the semiconductor layer;

j) removing the dielectric layer in the base region;

k) introducing a fourth dopant for electrical conduction of a second conductivity type opposite the first conductivity type into the base region using a third mask, whereby the height of the fourth doping is selected such that the doping for electrical conduction of the first conductivity type predominates at a side of the base region facing away from the gate electrode; and l) removing the third mask employed in step k);

m) using a fourth mask that has an opening in a region provided for a base terminal zone, introducing a dopant for electrical conduction of the second conductivity type into the semiconductor layer; and n) removing the fourth mask.

2. The method according to claim 1, wherein the second mask in step i) and the second mask in step k) are a common mask.

3. The method according to claim 1, wherein in step i), the opening of a first mask is limited to the region covered by the third mask employed in step m); and wherein the first mask employed in step i) is removed between step i) and step j) and is replaced before step k) by the third mask provided for step k).

4. The method according to claim 1, wherein the method is also for simultaneous manufacture of a MOSFET, and wherein the method further comprises:

in step b), also applying at least one gate electrode provided for a MOSFET; and in at least one of the steps e), i) and m), also introducing a doping for a drain region of the MOSFET.

5. The method according to claim 4, wherein the method further comprises the steps of:

in step e), also introducing a doping for the drain region of the MOSFET; and in step g), introducing a doping for a lightly doped transition region between the drain region and a channel region provided for the MOSFET.

6. The method according to claim 4, with which complementary MOSFETs are manufactured as a BiCMOS method, and wherein in at least one of the steps e) and i), a doping for a drain region of a MOSFET is also introduced; and wherein in step m), a doping for a drain region of a complementary MOSFET is also introduced.

7. The method according to claim 1, wherein bipolar transistors of a first type and of a second type complementary therewith are manufactured, and wherein:

o) the steps a) through c) ensue in common for the bipolar transistors to be manufactured and basic doping is thereby respectively produced with a conductivity type of emitter and collector of a type to be manufactured;

p) the sequence of steps d) is implemented for the first type of transistors to be manufactured;

q) a sequence of steps that corresponds to the sequence of steps d) with respectively interchanged conductivity types is implemented for the second type of transistors to be manufactured; and wherein in the sequence of steps p), the step m) is implemented such that a step of the sequence of steps q) corresponding to the step e) or the step i) occurs simultaneously therewith with dopant for the second conductivity type.

8. The method according to claim 7, with which complementary MOSFETs are also manufactured as a CBiCMOS method, and wherein the method further comprises:

in step b), also applying at least one gate electrode provided for a MOSFET;

in step e), introducing a doping for a drain region of a MOSFET;

in step g), introducing a doping for a lightly doped transition region between this drain region and a channel region provided for the MOSFET;

in the sequence of steps q), the step corresponding to the step e) with dopant for the second conductivity type being implemented such that a dopant for a drain region of a MOSFET is simultaneously introduced therewith; and in the sequence of steps q), the step corresponding to the step g) with dopant for the second conductivity type being implemented such that a doping for a lightly doped transition region between this drain region and a channel region provided for the same MOSFET is simultaneously introduced therewith.

9. A method for manufacturing a lateral bipolar transistor and a MOSFET, comprising the steps of:

a) laterally insulating a semiconductor layer and providing the semiconductor layer with a basic doping for electrical conduction of a first conductivity type;

b) applying a stripe-shaped gate electrode onto the semiconductor layer adjoining a region provided for a base region and applying at least one gate electrode for a MOSFET;

c) applying a dielectric layer over the semiconductor layer and the gate electrode;

d) sequencing the following steps e) through h) in the sequence in which said steps e) through h are recited, sequencing the following steps i) through l) in the sequence in which said steps i through l are recited, and, after step l), the following steps m) and n) sequence successively;

e) using a first mask with an opening that, with reference to a plane of the semiconductor layer, is present laterally next to the gate electrode on a side facing away from said region provided for said base region and that extends at least up to a region occupied by the gate electrode, introducing a first dopant for electrical conduction of the first conductivity type into the semiconductor layer and introducing a doping for a drain region of the MOSFET;

f) removing the dielectric layer in the region of the opening of the first mask;

g) introducing a second dopant for electrical conduction of the first conductivity type into the semiconductor layer; and h) removing the first mask;

i) using a second mask having an opening that, with respect to the plane of the semiconductor layer, is present next to the gate electrode on a side facing toward the base region and that extends at least up to said region occupied by the gate electrode, introducing a third dopant for electrical conduction of the first conductivity type into the semiconductor layer;

j) removing the dielectric layer in the base region;

k) introducing a fourth dopant for electrical conduction of a second conductivity type opposite the first conductivity type into the region using a third mask, whereby the height of the fourth doping is selected such that the doping for electrical conduction of the first conductivity type predominates at a side of the base region facing away from the gate electrode; and l) removing the third mask employed in step k);

m) using a fourth mask that has an opening in a region provided for a base terminal zone, introducing a dopant for electrical conduction of the second conductivity type into the semiconductor layer; and n) removing the fourth mask.

10. The method according to claim 9, wherein the first mask in step i) and the second mask in step k) are a common mask.

11. The method according to claim 9, wherein in step i), the opening of a first mask is limited to the region covered by the third mask employed in step m); and wherein the first mask employed in step i) is removed between step i) and step j) and is replaced before step k) by the third mask provided for step k).

12. The method according to claim 9, with which complementary MOSFETs are manufactured as a BiCMOS method, and wherein in the step i), a doping for a drain region of a complementary MOSFET is also introduced; and in step m), a doping for a drain region of the complementary MOSFET is also introduced.

13. A method for manufacturing a lateral bipolar transistors of a first type and of a second type comprising the steps of:

a) laterally insulating a semiconductor layer and providing the semiconductor layer with a basic doping for electrical conduction of a first conductivity type;

b) applying a stripe-shaped gate electrode onto the semiconductor layer adjoining a region provided for a base region;

c) applying a dielectric layer over the semiconductor layer and the gate electrode;

d) sequencing the following steps e) through h) in the sequence in which said steps e) through h are recited, sequencing the following steps i) through l) in the sequence in which said steps i) through l are recited, and, after step l), the following steps m) and n) sequence successively;

e) using a first mask with an opening that, with reference to a plane of the semiconductor layer, is present laterally next to the gate electrode on a side facing away from said region provided for said base region and that extends at least up to a region occupied by the gate electrode, introducing a first dopant for electrical conduction of the first conductivity type into the semiconductor layer;

f) removing the dielectric layer in the region of the opening of the first mask;

g) introducing a second dopant for electrical conduction of the first conductivity type into the semiconductor layer; and h) removing the first mask;

i) using a second mask having an opening that, with respect to the plane of the semiconductor layer, is present next to the gate electrode on a side facing toward the base region and that extends at least up to said region occupied by the gate electrode, introducing a third dopant for electrical conduction of the first conductivity type into the semiconductor layer;

j) removing the dielectric layer in the base region;

k) introducing a dopant for electrical conduction of a second conductivity type opposite the first conductivity type into the region using a third mask, whereby the height of the fourth doping is selected such that the doping for electrical conduction of the first conductivity type predominates at a side of the base region facing away from the gate electrode; and l) removing the third mask employed in step k);

m) using a fourth mask that has an opening in a region provided for a base terminal zone, introducing a dopant for electrical conduction of the second conductivity type into the semiconductor layer;

n) removing the fourth mask;

o) the steps a) through c) ensuing in common for the bipolar transistors to be manufactured and basic doping is thereby respectively produced with a conductivity type of emitter and collector of a type to be manufactured;

p) the sequences of step d) being implemented for the first type of transistors to be manufactured;

q) sequences of steps that corresponds to the sequences of step d) with respectively interchanged conductivity types being implemented for the second type of transistors to be manufactured; and in the sequences of step p), the step m) being implemented such that a step of the sequences of step q) corresponding to the step e) or the step i) occurs simultaneously therewith with dopant for the second conductivity type.

14. The method according to claim 13, wherein the first mask in step i) and the second mask in step k) are a common mask.

15. The method according to claim 13, wherein in step i), the opening of a first mask is limited to the region covered by the third mask employed in step m); and wherein the first mask employed in step i) is removed between step i) and step j) and is replaced before step k) by the third mask provided for step k).

16. The method according to claim 13, wherein the method is also for simultaneous manufacture of a MOSFET, and wherein the method further comprises:

in step b), also applying at least one gate electrode provided for the MOSFET; and in at least one of the steps e), i) and m), also introducing a doping for a drain region of the MOSFET.

17. The method according to claim 16, wherein the method further comprises the steps of:

in step e), also introducing a doping for the drain region of the MOSFET; and in step g), introducing a doping for a lightly doped transition region between this drain region and a channel region provided for the MOSFET.

18. The method according to claim 17, with which complementary MOSFETs are also manufactured as a CBiCMOS method, and wherein the method further comprises:

in step b), also applying at least one gate electrode provided for a MOSFET;

in step e), introducing a doping for a drain region of a MOSFET;

in step g), introducing a doping for a lightly doped transition region between this drain region and a channel region provided for the MOSFET;

in the sequence of steps q), the step corresponding to the step e) with dopant for the second conductivity type being implemented such that a dopant for a drain region of a MOSFET is simultaneously introduced therewith; and wherein in the sequence of steps q), the step corresponding to the step g) with dopant for the second conductivity type being implemented such that a doping for a lightly doped transition region between this drain region and a channel region provided for the same MOSFET is simultaneously introduced therewith.

* * * * *